United States Patent
Park et al.

(10) Patent No.: US 7,804,084 B2
(45) Date of Patent: Sep. 28, 2010

(54) PHASE CHANGE MEMORY ELEMENTS HAVING A CONFINED PORTION OF PHASE CHANGE MATERIAL ON A RECESSED CONTACT

(75) Inventors: Joon-sang Park, Seoul (KR); Chang-ki Hong, Gyeonggi-do (KR); Sang-yong Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 239 days.

(21) Appl. No.: 12/113,846

(22) Filed: May 1, 2008

(65) Prior Publication Data

US 2008/0230762 A1 Sep. 25, 2008

Related U.S. Application Data

(62) Division of application No. 11/100,759, filed on Apr. 7, 2005, now Pat. No. 7,384,825.

(30) Foreign Application Priority Data

Apr. 10, 2004 (KR) ...................... 10-2004-0024741

(51) Int. Cl.
*H01L 45/00* (2006.01)
(52) U.S. Cl. .................. 257/3; 257/E45.002
(58) Field of Classification Search .............. 257/3, 257/4, E45.002
See application file for complete search history.

(56) References Cited

U.S. PATENT DOCUMENTS

| | | | |
|---|---|---|---|
| 6,117,720 A | 9/2000 | Harshfield | |
| 6,545,287 B2 | 4/2003 | Chiang | |
| 6,566,700 B2 | 5/2003 | Xu | |
| 6,586,761 B2 | 7/2003 | Lowrey | |
| 6,791,102 B2 | 9/2004 | Johnson et al. | |
| 6,815,704 B1 | 11/2004 | Chen | |
| 2005/0018526 A1 | 1/2005 | Lee | |
| 2005/0029504 A1* | 2/2005 | Karpov | ........................... 257/4 |
| 2005/0185444 A1 | 8/2005 | Yang et al. | |
| 2005/0263801 A1 | 12/2005 | Park et al. | |
| 2006/0006374 A1 | 1/2006 | Chang | |

FOREIGN PATENT DOCUMENTS

JP 10-265974 A 10/1998

* cited by examiner

*Primary Examiner*—Jerome Jackson, Jr.
*Assistant Examiner*—Paul A Budd
(74) *Attorney, Agent, or Firm*—Meyers Bigel Sibley & Sajovec, P.A.

(57) ABSTRACT

Methods of fabricating phase change memory elements include forming an insulating layer on a semiconductor substrate, forming a through hole penetrating the insulating layer, forming a lower electrode in the through hole and forming a recess having a sidewall comprising a portion of the insulating layer by selectively etching a surface of the lower electrode relative to the insulating layer. A phase change memory layer is formed on the lower electrode. The phase change memory layer has a portion confined by the recess and surrounded by the insulating layer. An upper electrode is formed on the phase change memory layer. Phase change memory elements are also provided.

8 Claims, 6 Drawing Sheets

PHASE CHANGE MEMORY ELEMENTS HAVING A CONFINED PORTION OF PHASE CHANGE MATERIAL ON A RECESSED CONTACT

RELATED APPLICATIONS AND CLAIM OF PRIORITY

This application is a divisional of U.S. application Ser. No. 11/100,759, filed Apr. 7, 2005 now U.S. Pat. No. 7,384,825, and is related to and claims priority from Korean Patent Application No. 2004-24741, filed on Apr. 10, 2004, in the Korean Intellectual Property Office, the disclosures of both of which are incorporated by reference herein in their entirety.

FIELD OF THE INVENTION

The present invention relates to memory elements, and more particularly, to methods of fabricating phase change memory elements.

BACKGROUND OF THE INVENTION

A phase change memory element is a memory element for storing information using the characteristics of electric conductivity or a resistance difference between a crystalline phase and an amorphous phase of a specific phase change material. The phase change memory element forms a memory cell electrically connected to a transistor element or the like, formed on a semiconductor substrate for addressing and read/write operations of the device. In the memory element, information is stored using a conductivity difference in accordance with the phase change of a memory layer, and data is stored in the phase change memory element including a phase change region.

The phase change memory cell operates such that a current flowing through a transistor electrically heats a phase change region, and the structure of the phase change material is reversibly changed to a crystalline state or an amorphous state to store information. The stored information can be read by flowing a relatively low current through the phase change region and measuring the resistance of the phase change material.

In the formation of such a phase change memory element, one technical problem may be that power consumption may be excessively large because a phase change material may be required to be heated higher than its melting point for a write operation, particularly, a reset operation for changing a crystalline structure to an amorphous structure. Furthermore, another problem may result from the transistor element for operating the phase change memory element becoming smaller in size. In such a case, the power transferred to the phase change memory element through the transistor element may decrease.

In order to provide low power operation of the phase change memory element, the volume of the phase change region should be substantially minimized and the phase change region thermally insulated from its peripheral regions. Therefore, various types of device structures have been introduced for the low power operation of the phase change memory element, but there still exist many restrictions in the processes of fabricating semiconductor devices including the phase change memory elements. Particularly, with the high integration of phase change memory cell elements, many problems have been reported on the limits of a photo etching process for pattern formation and process restrictions related to an etch selectivity generated in the pattern formation.

SUMMARY OF THE INVENTION

Some embodiments of the present invention provide phase change memory elements and methods of fabricating phase change memory elements that include forming an insulating layer on a semiconductor substrate, forming a through hole penetrating the insulating layer, forming a lower electrode in the through hole and forming a recess having a sidewall comprising a portion of the insulating layer by selectively etching a surface of the lower electrode relative to the insulating layer, A phase change memory layer is formed on the lower electrode. The phase change memory layer has a portion confined by the recess and surrounded by the insulating layer. An upper electrode is formed on the phase change memory layer.

In additional embodiments of the present invention, forming the lower electrode is preceded by forming a spacer on a sidewall of the through hole such that a transverse cross-sectional area of the lower electrode in the through hole is smaller than a transverse-cross-sectional area of the through hole.

Further embodiments of the present invention provide methods of fabricating a phase change memory element that include forming an insulating layer on a semiconductor substrate, forming a through hole penetrating the insulating layer, forming a lower electrode comprising a titanium-containing alloy in the through hole, selectively etching a surface of the lower electrode relative to the insulating layer using a wet etch using an etchant comprising an acid and an iodine-containing oxidizer to provide a recess having a sidewall comprising a portion of the insulating layer, forming a phase change memory layer having a portion confined in the recess and surrounded by the insulating layer on the lower electrode and forming an upper electrode on the phase change memory layer. Forming the lower electrode may be preceded by forming a spacer on at least a portion of the sidewall of the recess such that a surface area of the lower electrode is smaller than a surface area of an opening of the through hole.

Furthermore, forming a lower electrode may include depositing titanium nitride (TiN). Forming the lower electrode may also include depositing titanium aluminum nitride (TiAlN). An oxide layer may also remain on a surface of the etched lower electrode as a bottom of the recess and the oxide layer may be formed by the oxidation of the surface of the lower electrode by the etchant. The etchant may include sulfuric acid and/or phosphoric acid, and the iodine-containing oxidizer may include $KIO_3$, $NH_4IO_3$, $LiIO_3$, $CaIO_3$, $BaIO_3$, $KI$, and/or $NH_4I$. The etchant may include the oxidizer containing acid and iodine with water added. The wet etch may be performed using an etchant comprising sulfuric acid ($H_2SO_4$), ammonium iodate ($NH_4IO_3$), and water.

In still further embodiments of the present invention, methods of fabricating a phase change memory element include forming an insulating layer on a semiconductor substrate, forming a through hole penetrating the insulating layer, forming a spacer on a sidewall of the through hole, the spacer including different insulating layers, forming a lower electrode comprising a titanium-containing alloy in a gap defined by the spacer and the through hole, etching a surface of the lower electrode relative to the insulating layer using a wet etch using an etchant including an acid and an iodine-containing oxidizer to provide a recess having a sidewall comprising a portion of the spacer, forming a phase change memory layer on the lower electrode and having a portion confined in the recess and surrounded by the spacer and forming an upper electrode on the phase change memory layer.

In particular embodiments of the present invention, forming a spacer includes forming a first spacer layer on a sidewall of the through hole such that the width covering a lower portion of the sidewall of the through hole is greater than a width covering an upper portion of the sidewall of the through hole, forming a second spacer layer such that a width covering the upper portion of the sidewall of the through hole is greater than a width covering the portion of the lower sidewall of the through hole, the second spacer layer a poorer step coverage than the first spacer layer and etching the second spacer layer and the first spacer layer to provide a vertical sidewall profile of the spacer.

In further embodiments, the first spacer layer comprises silicon oxy-nitride (SiON), and the second spacer layer comprises silicon nitride ($Si_3N_4$).

Furthermore, forming a lower electrode may include depositing titanium nitride (TiN). Forming the lower electrode may also include depositing titanium aluminum nitride (TiAlN). An oxide layer may remain on a surface of the etched lower electrode as a bottom of the recess and the oxide layer may be formed by the oxidation of the surface of the lower electrode by the etchant. The wet etch may be performed to etch the lower electrode at an etch rate of 20 to 50 Å/min.

Further embodiments of the present invention provide methods of fabricating a phase change memory element that include forming a transistor element having a word line on a semiconductor substrate, forming a first insulating layer on the transistor element, forming two first interconnecting contacts penetrating the first insulating layer and each electrically connected to the transistor element, forming a second insulating layer on the first interconnecting contacts, forming a bit line penetrating the second insulating layer and connected to one of the first interconnecting contacts, and a second interconnecting contact penetrating the second insulating layer and connected to the other one of the first interconnecting contacts, forming a third insulating layer on the second interconnecting contact and the bit line, forming a through hole penetrating the third insulating layer and exposing an upper surface of the second interconnecting contact, forming a spacer on a sidewall of the through hole, the spacer including insulating layers different from each other, forming a lower electrode for filling a gap between the spacers inside the through hole, the lower electrode being composed of titanium-containing alloy, forming a recess by selectively etching a surface of the lower electrode relative to the insulating layer through a wet etch using an etchant including an acid and an iodine-containing oxidizer to expose the sidewall of the spacer, forming a phase change memory layer on the lower electrode and having a portion confined in the recess and surrounded by the spacer and forming an upper electrode on the phase change memory layer.

The bit line and the first interconnecting contact and/or the second interconnecting contact may include tungsten layers. Furthermore, forming a lower electrode may include depositing titanium nitride (TiN). Forming the lower electrode may also include depositing titanium aluminum nitride (TiAlN). An oxide layer may remain on a surface of the etched lower electrode as a bottom of the recess and the oxide layer may be formed by the oxidation of the surface of the lower electrode by the etchant.

Still further embodiments of the present invention may provide phase change memory elements that include an insulating layer on a semiconductor substrate, the insulating layer having a through hole penetrating the insulating layer, a lower electrode in a recess in the through hole, wherein the recess has a sidewall comprising a portion of the insulating layer, a phase change memory layer on the lower electrode, the phase change memory layer having a portion confined by the recess and surrounded by the insulating layer and an upper electrode on the phase change memory layer.

Additional embodiments of the present invention include a spacer on a sidewall of the through hole such that a transverse cross-sectional area of the lower electrode in the through hole is smaller than a transverse-cross-sectional area of the through hole. The spacer may include a first spacer layer on the sidewall of the through hole and a second spacer layer on the first spacer layer. The first spacer layer may be a first insulating material having a first step coverage characteristic and the second spacer layer may be a second insulating material having a second step coverage characteristic indicating less step coverage than the first insulating material. The spacer may have a substantially vertical sidewall. An oxide layer may also be disposed between the lower electrode and the portion of the phase change material layer confined in the recess. The lower electrode comprises TiN and/or TiAlN.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the present invention provide a phase change memory element structure having a reduced contact area between an electrode and a phase change material layer. In the structure, a contact hole is formed through an insulating layer and a lower electrode is formed in the shape of a contact or plug confined inside the contact hole. In some embodiments, a spacer is formed on a sidewall of the contact hole to further reduce the cross-sectional diameter of the lower electrode. The spacer may be a double layer spacer that may ensure the reduction of the cross-sectional diameter of the lower electrode more stably and effectively.

Some embodiments of the present invention provide structures in which a surface of the lower electrode is recessed into the contact hole by forming a recess in an an upper portion of the contact hole on the lower electrode, and a phase change memory layer is formed in the recess to contact the lower electrode. Thus, the contact area between the phase change memory layer and the lower electrode depends on the transverse cross-sectional area of the recessed lower electrode. A portion of the phase change memory layer near the contact area, that is, the structure in which the phase change memory layer is confined by the contact hole, may be surrounded by an insulating layer acting as a sidewall or sidewalls of the contact hole or may be surrounded by a spacer or spacers on a sidewall of the contact hole. As such, the confined portion of the phase change material and the lower contact may be insulated by the insulation layer and/or the spacer(s). By thermally insulating the confined portion of the phase change material layer generating phase change or phase transformation may be more effective as heat generated by the current flowing through the lower electrode may be confined by the thermal insulation.

To provide a confined structure of the phase change memory layer a surface of the lower electrode is selectively etched and recessed. In order to selectively etch a titanium alloy, for example, a titanium nitride (TiN) used as the lower electrode, a wet-etching process may be employed using an etchant including a mixture of an acid and an oxidizer, for example, an etchant including a mixture of sulfuric acid ($H_2SO_4$), ammonium iodate ($NH_4IO_3$), and water ($H_2O$), which is referred to as a sulfuric iodate mixture (SIM).

The SIM etchant may include less than about 30 percent by weight (wt %) of water, and about 0.003 to 10 percent by weight of iodine-containing oxidizer. Describing the etchant in more detail, the etchant of the wet-etching according to some embodiments of the present invention may include an acidic solution and an iodine-containing oxidizer. The acidic solution may be sulfuric acid, phosphoric acid, or the like, and the iodine-containing oxidizer may be an iodate such as $KIO_3$, $NH_4IO_3$, $LiIO_3$, $CaIO_3$, $BaIO_3$, or the like. If the etchant includes more water, KI, $NH_4I$, or the like can also be used in addition to the iodates mentioned as the iodine-containing oxidizer. In the case of using sulfuric acid, an appropriate concentration to use of the sulfuric acid is higher than about 96%.

If water is added to the etchant, the etching ability of the acidic solution and the iodine-containing oxidizer may be changed. The addition of water may further improve the dissociation of the acidic solution and the iodine-containing oxidizer. Therefore, the amount of water added is proportional to the etching ability of the etchant. In some embodiments, the etchant includes less than about 30 percent by weight of water. Further, in some embodiment, the etchant includes an iodine-containing oxidizer with about 0.003 to 10 percent by weight.

The etching time is typically inversely proportional to temperature. The etching ability is typically proportional to temperature. In some embodiments, the etching process may be performed in a temperature range from room temperature to about 120° C. However, the temperature range can be changed in accordance with the process.

The wet-etching process using the SIM is effective to etch a titanium alloy, particularly, titanium nitride, but its etching effect is substantially suppressed in an insulating material That surrounds the lower electrode, for example, in silicon nitride ($Si_3N_4$), silicon oxide such as silicon oxy-nitride (SiON) and PE-TEOS, or the like.

Further, because wet-etching using the SIM serves to protect the tungsten layer, the wet-etching does not work on the tungsten layer; that is, the tungsten layer is not substantially etched by the wet-etch using the SIM. This is because the iodate of the SIM reacts with tungsten as an oxidizer and forms a passivation layer, such as a tungsten trioxide layer ($WO_3$), which is very stable to the acidic solution, on the surface.

Therefore, if the lower electrode, which is composed of titanium nitride, is selectively etched, damage to the tungsten conductive layer disposed under the lower electrode as well as lifting by such an etchant used for the wet-etching may be reduced or prevented.

A process of providing a confined part of a phase change layer on a recessed lower electrode according to some embodiments of the present invention will be explained in detail, using as an example the case in which a surface of the lower electrode, which is composed of titanium nitride, is recessed through wet-etching using the SIM.

FIGS. 1 through 10 are schematic sectional views illustrating a method of fabricating a phase change memory element according to some embodiments of the present invention. FIG. 11 is a schematic sectional view illustrating a phase change memory element incorporated in a memory cell, according to some embodiments of the present invention.

Figure 1:
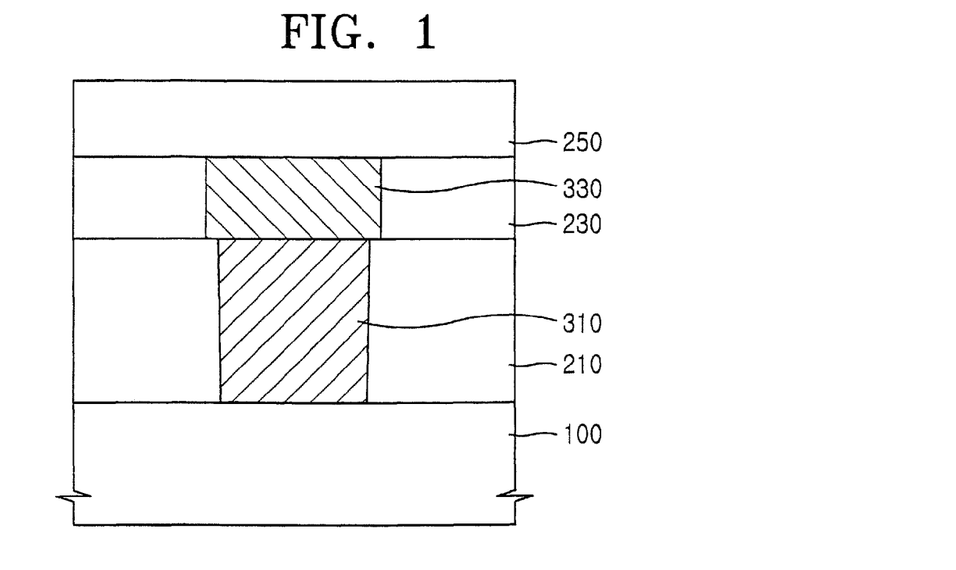
FIGS. 1 through 10 are schematic sectional views illustrating methods of fabricating phase change memory elements according to some embodiments of the present invention.

FIG. 1 schematically shows that interconnecting contacts 310, 330 are formed on a semiconductor substrate 100, and the interconnecting contacts 310, 330 function to electrically connect the semiconductor substrate 100 with a phase change memory element, in which data of the device is stored.

Referring to FIGS. 1 and 11, a phase change memory element 701 forms a memory cell as a structure being electrically connected to a cell transistor element 705, which includes a word line 171 as a gate, drain/source regions 173, and a bit line 331 on a semiconductor substrate 100.

The cell transistor element 705 is a circuit for addressing or memory operations, and the cell transistor element 705 is first formed on the semiconductor substrate 100. That is, as shown in FIG. 11, an isolation layer 150 is formed on the semiconductor substrate 100, and the drain/source regions 173 and the word line 171 as a gate are formed on the semiconductor substrate 100. As such, the cell transistor element 705 is formed through transistor formation processes which may be conventional transistor formation processes.

A first insulating layer 210 is formed to cover the cell transistor element 705. The first insulating layer 210 may be a first interlayer dielectric layer (ILD1), and may be composed of an insulating material such as silicon oxide. A first interconnecting contact 310 is formed through the first insulating layer 210.

The first interconnecting contact 310 may be formed by forming a contact hole penetrating the first insulating layer 210, forming a conductive layer, for example, a tungsten layer in the contact hole, and performing planarization of the tungsten layer by chemical mechanical polishing (CMP). The first interconnecting contact 310 is employed as one component of the interconnecting contacts 310, 330 for electrically connecting the phase change memory element 701 and the semiconductor substrate 100 as shown in FIG. 11.

Along with the first interconnecting contact 310, a third interconnecting contact 311 for electrically connecting the bit line 331 and the cell transistor 705 can be formed through the same process as shown in FIG. 11.

A second insulating layer 230 as a second interlayer dielectric layer (ILD2) for covering the first interconnecting contact 310 is also formed. A second interconnecting contact 330 is formed to penetrate the second insulating layer 230 and be electrically connected to the first interconnecting contact 310. The second interconnecting contact 330 can be formed at the same level as that of the bit line 331, as shown in FIG. 11, and can be formed along with the bit line 331.

For example, a contact hole is formed through the second insulating layer 230 to expose an upper surface of the first interconnecting contact 310, and a horizontally extended groove or a trench for exposing an upper surface of the third interconnecting contact 311 is also formed through a photolithography process. Then, a conductive layer, for example, a tungsten layer is formed in the trench and the contact hole, and the tungsten layer is planarized, thereby separating the portions filling the trench and the contact hole respectively. Thus, the bit line 331 in the trench and electrically connected to the third interconnecting contact 311, and the second interconnecting contact 330 electrically connected to the first interconnecting contact 310 may be formed at the same level.

A third insulating layer 250 as a third interlayer dielectric layer (ILD3) is formed to cover the second interconnecting contact 330 and to cover the bit line 331 for insulation, to define the shape of a lower electrode and to provide a confined structure of the phase change memory layer. The thickness of the third insulating layer 250 is determined based on the height of a lower electrode formed to penetrate the third insulating layer 250, or the aspect ratio of the contact hole for the lower electrode, and the depth or thickness of the confined part of the phase change memory layer. For example, the third insulating layer 250 can be composed of silicon oxide such as a PE-TEOS layer at a thickness of about 1000 Å.

Figure 2:
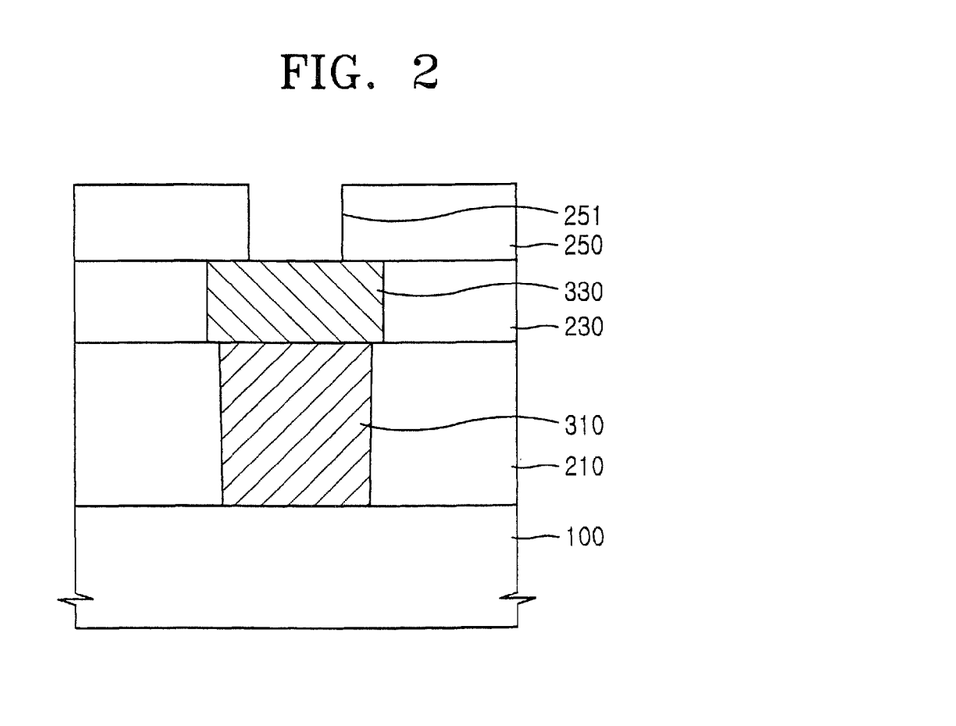

FIG. 2 schematically shows that a through hole 251 is formed through the third insulating layer 250 to expose an upper surface of the second interconnecting contact 330. The through hole 251 can be formed through a photolithography process, and the diameter of the through hole 251 may be small to provide for a low power operation of the phase change memory element. However, the diameter of the through hole 251 may be limited by the limits of the photolithography process. In order to overcome the limits, a spacer(s) may be formed on the sidewall(s) of the through hole 251.

Figure 3:
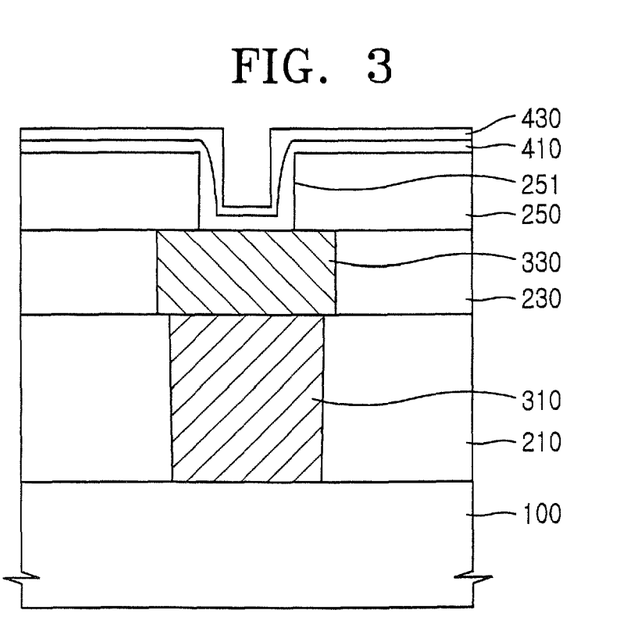

FIG. 3 shows that spacer layers 410, 430, which are composed of different materials, are sequentially formed on the sidewall(s) of the through hole 251 in order to form a spacer(s) on the sidewall(s) of the through hole 251. The first spacer layer 410 formed at a lower position may be composed of a material having a better step coverage property in comparison with that of the second spacer layer 430 formed on the first spacer layer 410. In some embodiments, the second spacer layer 430 is composed of a material having poor step coverage.

For example, in some embodiments, the first spacer layer 410 is composed of silicon oxy-nitride (SiON) and is formed to have a profile in which the width of the first spacer layer 410 increases toward the bottom of the through hole 251, as shown in FIG. 3. Further, the second spacer layer 430 is formed on the first spacer layer 410 and is composed of silicon nitride ($Si_3N_4$) to have a profile in which the width of the second spacer layer 430 increases toward the upper portion of the through hole 251. As such, the spacer layers 410, 430 on the sidewall(s) of the through hole 251 may have a substantially vertical profile like the sidewall profile of the through hole 251 by the formation of the dual spacer layers as described above.

Further, the silicon oxy-nitride layer of the first spacer layer 410 may function to improve a property of the interface between the silicon nitride layer of the second spacer layer 430 and the silicon oxide layer of the third insulating layer 250 as a sidewall(s) of the through hole 251. The silicon oxy-nitride layer serves to help the silicon nitride layer adhere to the silicon oxide layer at their interface.

Figure 4:
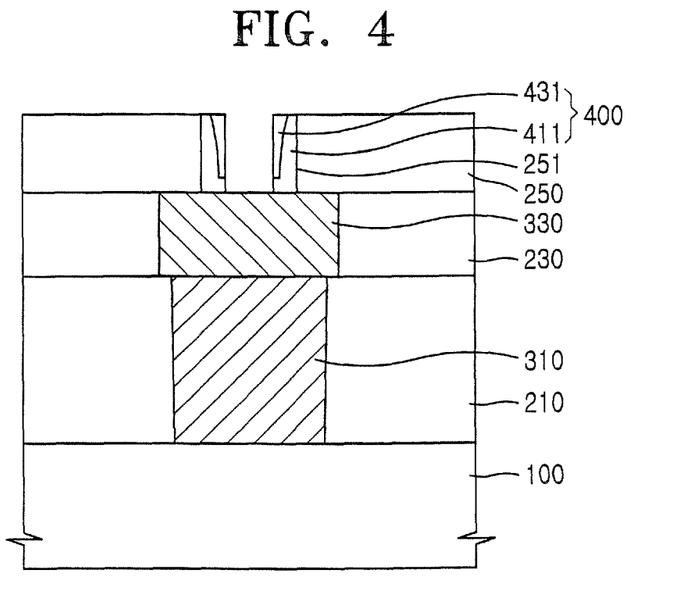

FIG. 4 schematically shows that the spacer layers 410, 430 are spacer-etched to form a spacer(s) 400. The spacer-etching can be performed by anisotropic dry etching or the like, and is performed to expose an upper surface of the second interconnecting contact 330 on the bottom of the through hole 251. The spacer(s) 400 formed by the spacer-etching is a dual spacer structure, which includes a first spacer 411 and a second spacer 431. Thus, with the formation of the first spacer layer 410 and the second spacer layer 430, the sidewall profile of the spacer(s) 400 on the sidewall(s) of the through hole 251 is substantially vertical.

As such, when the sidewall profile of the spacer(s) 400 is almost vertical or substantially vertical, it can be said that a gap between opposing portions of the spacer(s) 400 has substantially the same width at an upper portion and at a lower portion of the through hole 251. Thus, the line width of a lower electrode filling the portion between the spacers 400 is substantially uniform over its height, and also a confined part of the phase change memory layer, which is in the gap of the upper portion between opposing portions of the spacer(s) 400 also has a profile with a uniform line width. Therefore, the confined part of the phase change memory layer can be formed to be more effectively confined in the through hole 251, that is, the gap between opposing portions of the spacer(s) 400.

Figure 5:
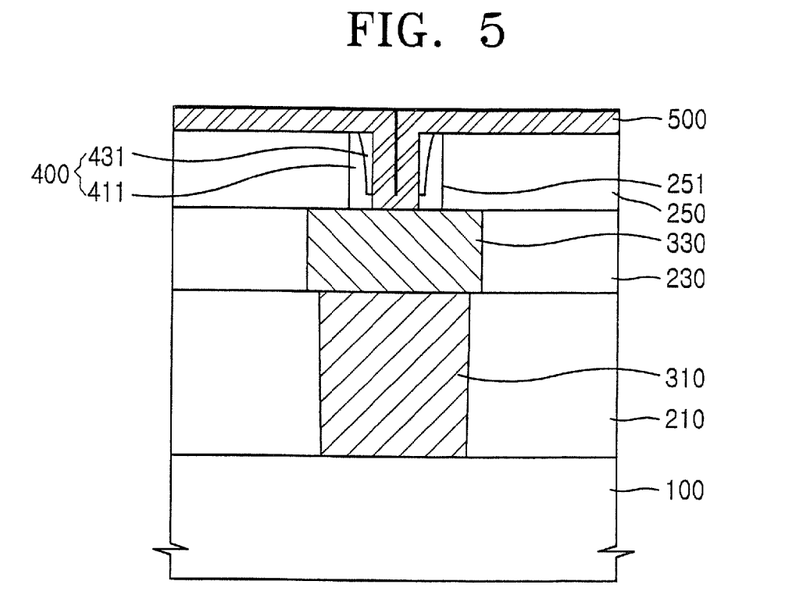

FIG. 5 schematically shows that a conductive layer, for example, a titanium nitride layer of a lower electrode layer 500 is formed to fill a gap between the spacers 400. The lower electrode layer 500 may be composed of a conductive material capable of suppressing a reaction with the material of the phase change memory layer, since the lower electrode directly contacts the phase change memory layer. For example, the lower electrode layer 500 may be composed of a titanium alloy such as titanium nitride or titanium aluminium nitride (TiAlN), and the like. In some embodiments, titanium nitride is deposited as a lower electrode layer 500 for the lower electrode, so as to fill the gap defined by the spacer(s) 400.

Figure 6:
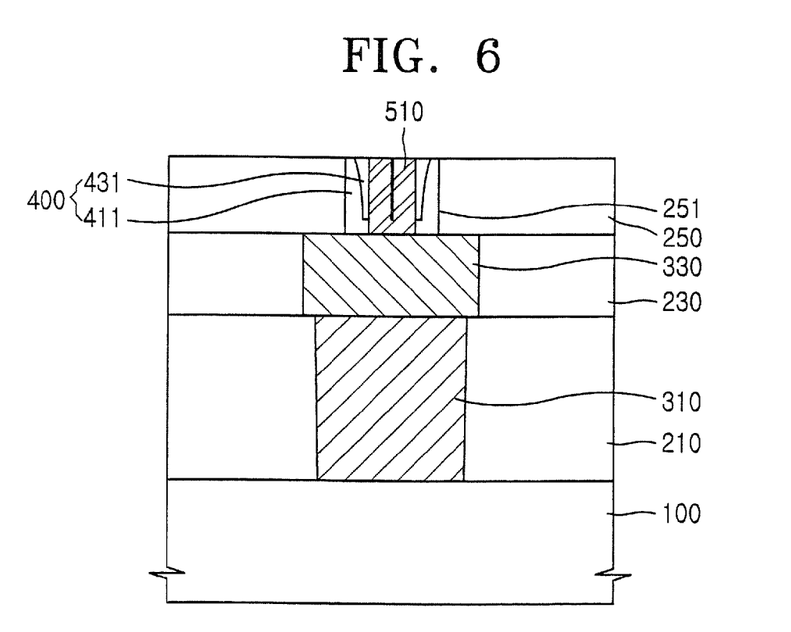

FIG. 6 schematically shows that a contact type of a lower electrode 510 is formed by planarizing the lower electrode layer 500 and in the through hole 251, that is, the gap defined by the spacer(s) 400. The surface of the lower electrode layer 500 (FIG. 5) is planarized using a CMP method or the like to confine the lower electrode layer 500 into the through hole 251, thereby forming the lower electrode 510 surrounded by the spacer(s) 400. The diameter of the lower electrode 510 may be varied in accordance with a very small dimension, for example, the width of the spacer 400 with the formation of the spacer(s) 400, and can be reduced to about 40 to 70 nm.

Figure 7:
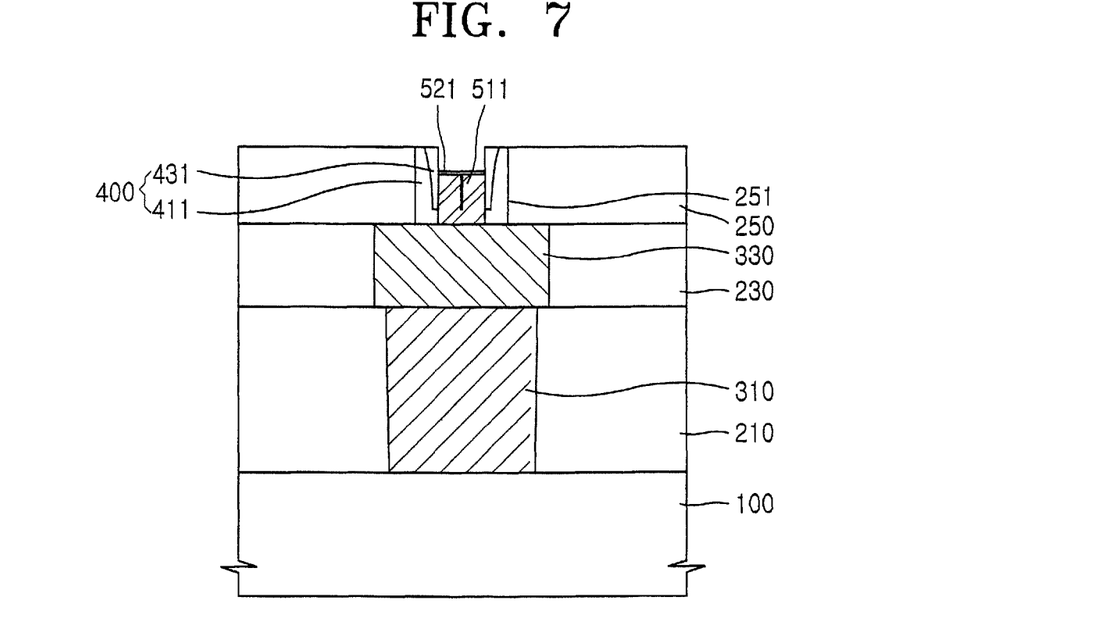

FIG. 7 schematically shows that the lower electrode 510 is recessed to form a recessed lower electrode 511. An upper surface of the lower electrode 510 is selectively etched and removed, to expose an upper sidewall portion of the spacer(s) 400. In some embodiments of the present invention, an etching process for recessing the lower electrode 511 is performed through a wet etching process using the SIM.

In particular embodiments of the present invention, the SIM including sulfuric acid ($H_2SO_4$), ammonium iodate ($NH_4IO_3$), and water ($H_2O$) provides a high etch rate relative to the titanium alloy but does not provide etching characteristics relative to other materials used for the layers around the lower electrode 511, for example, materials for the PE-TEOS layer as the third insulating layer 250, tungsten as the second interconnecting contact 330, and SiON and $Si_3N_4$ as the spacer layers 411, 431. That is, a wet etch using the SIM as an etchant selectively provides an etch rate relative to only a titanium alloy, particularly, titanium nitride.

In experiments of etching blanket types of layers, it is known that a wet etch using various kinds of wet etchants does not provide an etch rate relative to a TiN layer or provide an undesirable etch rate relative to tungsten. From the experimental results, in the case of 200:1 diluted hydrogen fluoride (HF) at about 65° C., it does not show a wet etch rate relative to TiN, shows an etch rate of 7.5 Å/min relative to SiN, an etch rate of 500 Å/min relative to SiON, an etch rate of 604 Å/min relative to PE-TEOS, and an etch rate of 0 Å/min relative to tungsten. Further, in the case of a standard cleaning solution SC1 at about 65° C., it shows an etch rate of 15 Å/min relative to TiN, an etch rate of 0 Å/min relative to SiN, SiON, PE-TEOS, and an etch rate equal to or less than about 1000 Å/min relative to tungsten.

In consideration of these experimental results, wet etching of TiN using HF is not appropriate. Further, in the case of wet etching using SC1, since it shows a very high etch rate relative to tungsten, the tungsten of the second interconnecting contact 330 under the lower electrode 511 may be damaged and etched during the etching of the lower electrode 511, the second interconnecting contact 330 may be lost and lifted, thereby causing process failure. In such cases, wet etching using HF or SC1 is not appropriate for selective etching of TiN for recessing the lower electrode 511.

On the contrary, experimental results for wet etching using the SIM at about 65° C. show that an etch rate of TiN is 42 Å/min, and etch rates of SiN, SiON, PE-TEOS and W are almost 0 Å/min. Therefore, the experimental results show that the lower electrode 511, which is composed of TiN, can be selectively recessed through wet etching using the SIM. Further, the experimental results show that the third insulating layer 250, the spacer(s) 400, and the second interconnecting contact 330 around the lower electrode 511 may not be etched and damaged during the etching using the SIM.

Therefore, in the case of wet etching using the SIM (referred to as SIM wet etching) according to some embodiments of the present invention, loss of the second interconnecting contact 330 and lift failure can be effectively prevented. Further, since a silicon oxide such as PE-TEOS is not etched in the SIM wet etching, the third insulating layer 250 may be prevented from being etched during the etching recess process of the lower electrode 511. If the third insulating layer 250 is etched and removed during a process of etching the lower electrode 511 along with the lower electrode 511, the third insulating layer 250 should be greater in thickness, and an aspect ratio of the through hole 251 is increased, and thus voids may occur during the deposition of TiN for the lower electrode 511. However, the SIM wet etching can suppress the etching of silicon oxide, thus allowing for thinner third insulating layer 250 and resulting in a reduced aspect ratio of the through hole 251.

Further, the SIM wet etching shows an etch rate of about 42 Å/min as described above, and from the etch rate, the SIM wet etching may be effective to partially control the etching process, such as recessing the lower electrode 511 as explained in reference to FIG. 7. Actually in the case of etching TiN, the SIM wet etching can show an etch rate of about 20 to 50 Å/min, the etching rate being controlled by the etching temperature, and thus the SIM wet etching may be effective for controlling the etching process. The SIM wet etching can be performed at a temperature range from room temperature to about 120° C., and it is stably performed at about 65° C.

A dry etching process shows a very high etch rate, for example, hundreds to thousands of Å/min. However, the high etch rate may not be appropriate for the process of recessing the lower electrode. An initial height of the lower electrode 511 is about 1000 Å, but it is very difficult to precisely control the recess of the lower electrode 511 using dry etching with a high etch rate as above. Further, it is reported that undesirable protrusions may be generated as etch residual material on the recessed lower electrode using dry etching. Therefore, the SIM wet etching may be more appropriate to recess the lower electrode 511 than the dry etching.

The SIM wet etching of TiN of the lower electrode 511 is assumed to be processed such that an iodate group of oxidizer of an oxide layer 521, for example, ammonium iodate ($NH_4IO_3$), is formed on the surface of the lower electrode 511, and the oxide layer 521 is etched and removed. Since the iodate compound acts as an oxidizer, and if the SIM is introduced on the lower electrode 511, it is expected that the surface of the lower electrode 511 is oxidized. With the repetition of the oxidation and the etching process, the TiN of the lower electrode 511 is gradually etched and recessed.

Figure 8:
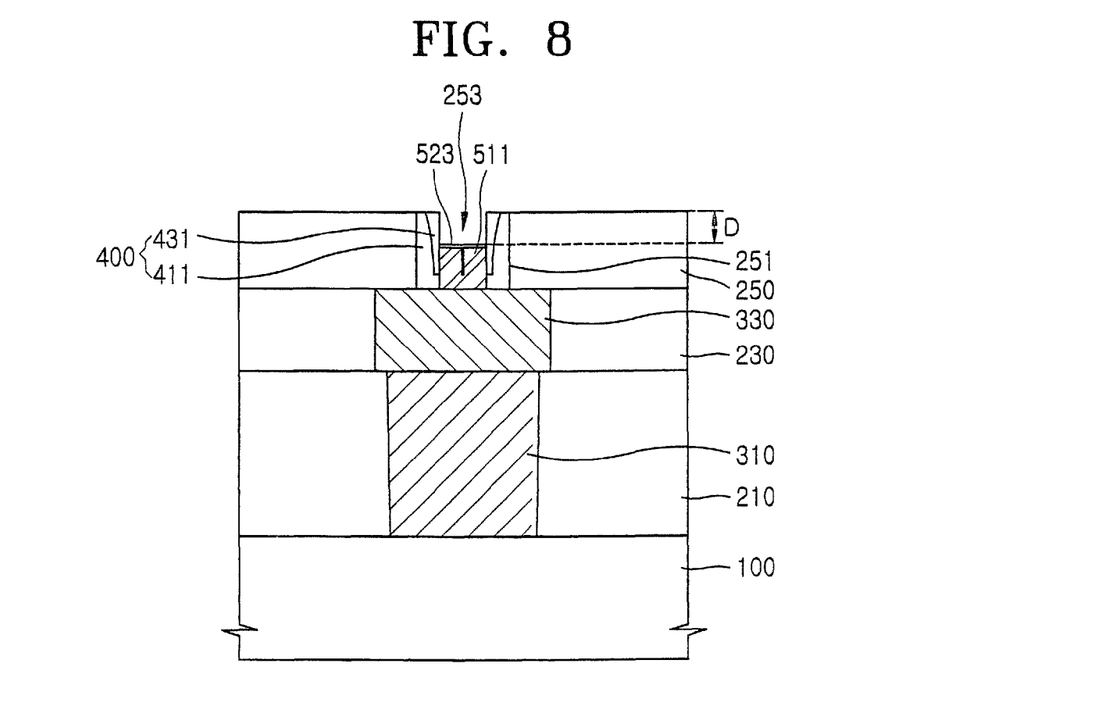

FIG. 8 schematically shows that a residual oxide layer 523 remains on the recessed lower electrode 511. The TiN of the lower electrode 511 is recessed using the SIM wet etching, thereby forming a recess 253 surrounded by the spacer(s) 400 on the lower electrode 511. The depth D of the recess 253 may be about 30 to 60% of the depth of the though hole 251. For example, when the initial thickness of the third insulating layer 250 is about 1000 Å, the depth D of the recess 253 may be about 400 Å.

The surface of the recessed lower electrode 511 exposed by the recess 253 may have the residual oxide layer 523 remaining thereon. The residual oxide layer 523 may be generated by the reaction of the iodate as an oxidizer during the SIM wet etching process, and the presence of the residual oxide layer 523 may be helpful to Joule heating when Joule-heating a phase change memory layer to be formed on the lower electrode 511.

Figure 9:
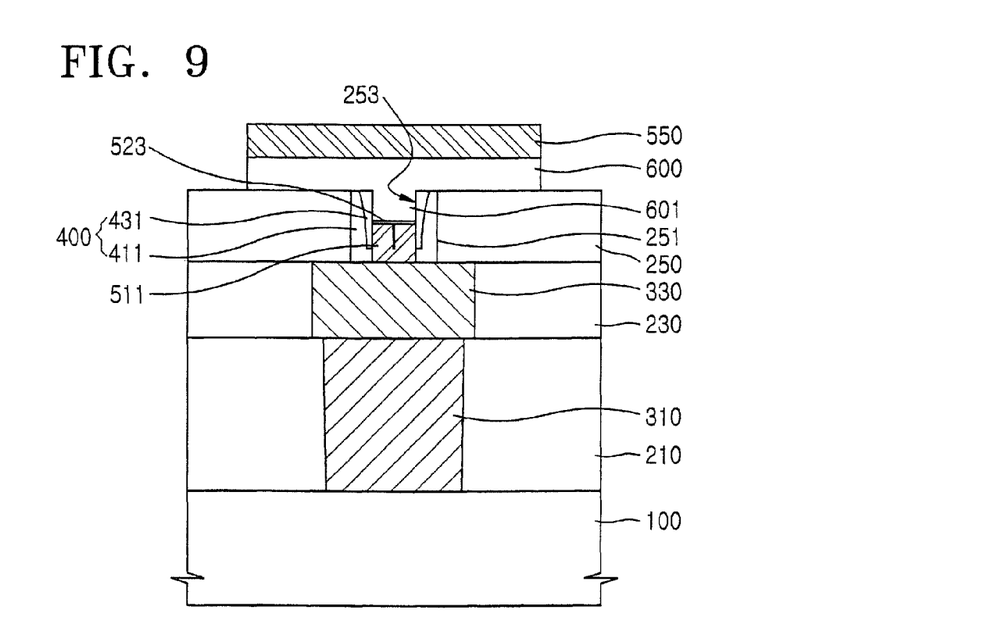

FIG. 9 schematically shows a phase change memory layer 600 in the recess 253 on the lower electrode 511. The recess 253 is filled with the phase change memory layer 600 by a sputtering method. The phase change memory layer 600 can be composed of GaSb, InSb, InSe, $Sb_2Te_2$, GeTe and the like as a binary compound, $Ge_2Sb_2Te_5$, InSbTe, GaSeTe, $SnSb_2Te_4$, InSbGe and the like as a ternary compound, and AgIbSbTe, (Ge, Sn)SbTe, GeSb(SeTe) and the like as a quaternary compound. In certain embodiments of the present invention, $Ge_2Sb_2Te_5$ is deposited to form the phase change memory layer 600.

The phase change memory layer 600 may fill the recess 253 and can extend onto the third insulating layer 250. As a result, a portion of the phase change memory layer 600 in the recess 253 is confined by the spacer(s) 400 and the third insulating layer 250 behind the space so as to confine a portion of the phase change memory layer 600 within the recess 253. Therefore, the portion of the phase change memory layer 600 in the recess 253 can be referred to as a "confined part" 601 of the phase change memory layer 600, and the bottom of the confined part 601 contacts the lower electrode 511 or the oxide layer 523 if such is present.

An upper electrode 550 on the phase change memory layer 600 may be composed of a conductive material such as titanium nitride or the like. As such, the phase change memory element 701 (FIG. 11) includes the phase change memory layer 600, the upper electrode 550, and the lower electrode 511.

Figure 10:
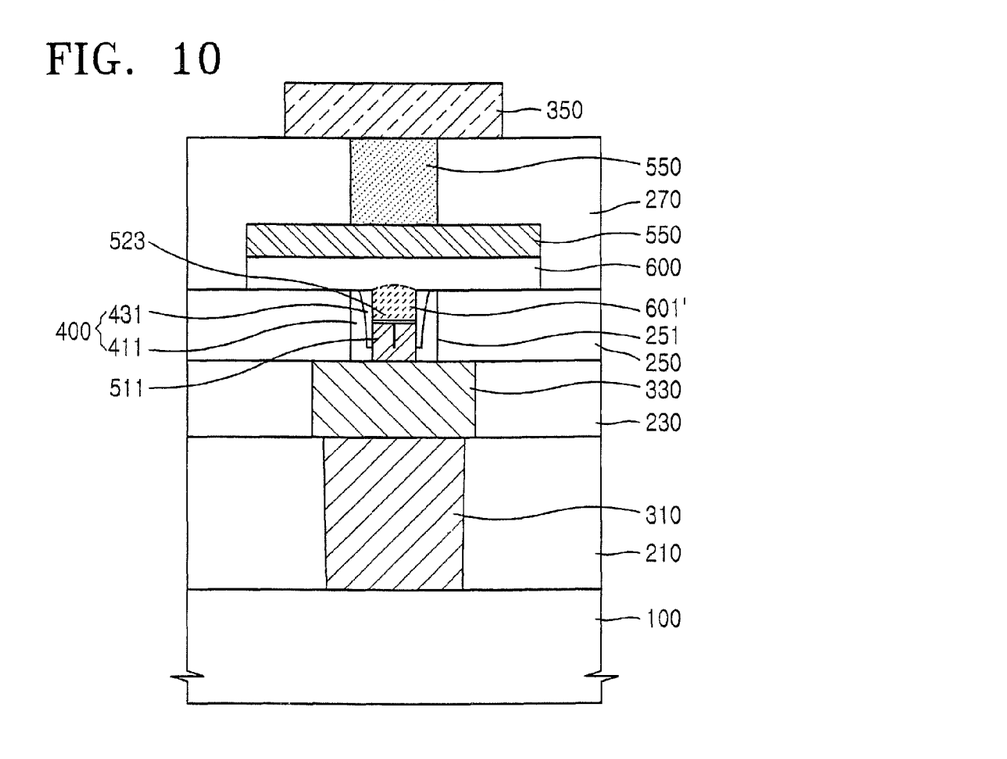
Figure 11:
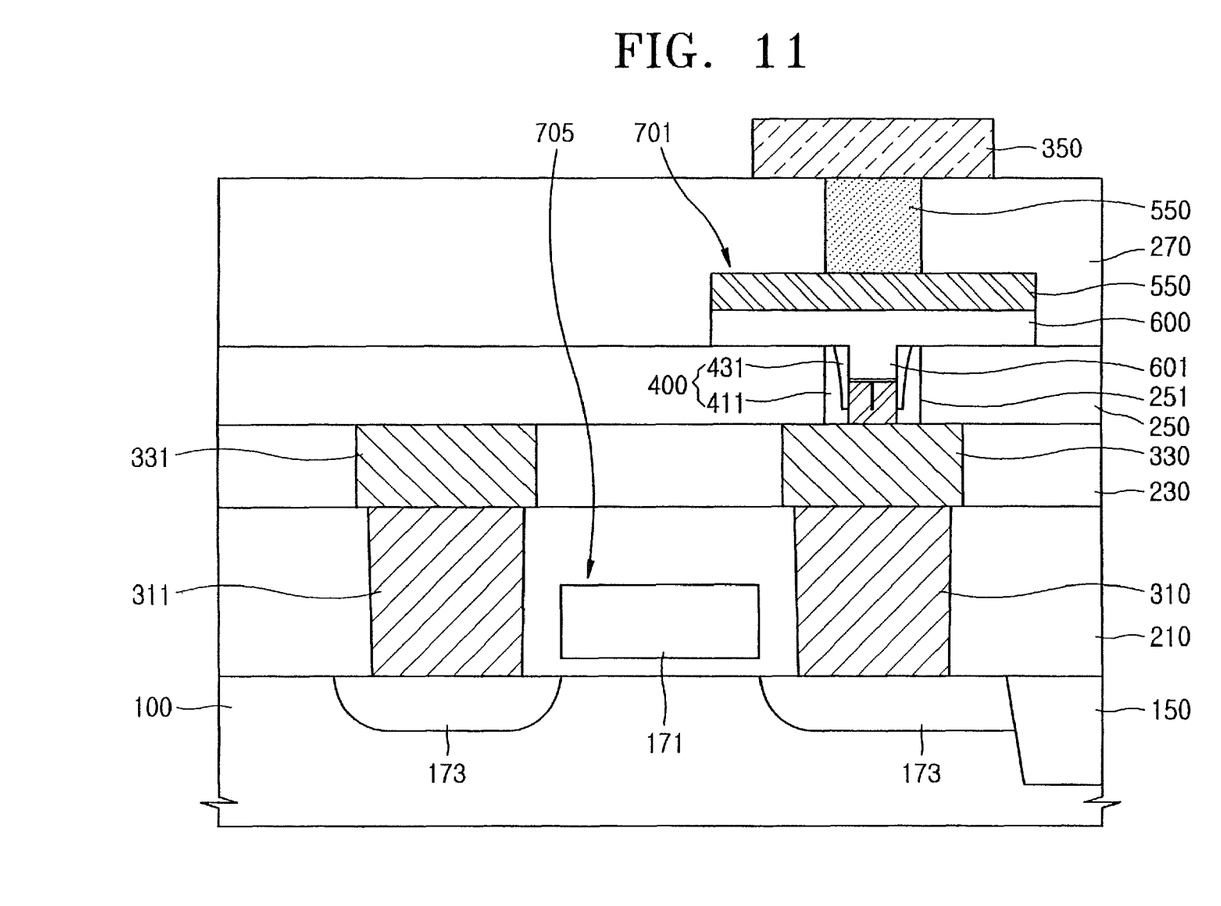
FIG. 11 is a schematic sectional view illustrating a phase change memory element incorporated into a memory cell, according to some embodiments of the present invention.

FIG. 10 schematically shows an interconnection 350, which is electrically connected to the upper electrode 550. Referring to FIG. 10, a fourth insulating layer 270 is formed to cover the upper electrode 550, and an upper electrode interconnecting contact 550 is formed to penetrate the fourth insulating layer 270 and contact the upper electrode 550 and is composed of a conductive material such as TiN or the like. Then, an interconnection 350 is formed to be connected to the upper electrode interconnecting contact 550, thereby completing the formation of the phase change memory element 701 (FIG. 11).

In order to store data in the phase change memory element 701 (FIG. 11), when the phase change memory layer 600 is heated by applying a high or middle level of current to the lower electrode 511, the Joule heat generated at the interface between the lower electrode 511 and the phase change memory layer 600 is effectively transferred to the confined part 601 of the phase change memory layer 600. The confined part 601 of the phase change memory layer 600, which is substantially contacted with the lower electrode 511, is surrounded by the spacer(s) 400 and the third insulating layer 250 behind the spacer(s) 400, and the spacer(s) 400 and the third insulating layer 250 have a relatively low thermal conductivity in comparison with a conductive layer, thereby serving as a thermal insulator. Therefore, the Joule heat is effectively transferred to the confined part 601 of the phase change memory layer 600.

The confined part 601 of the phase change memory layer 600 can be changed from its crystalline state by the Joule heat. For example, when the phase change memory layer 600 is in a crystalline state, the confined part 601 can be changed into an amorphous state by the Joule heat. Therefore, the confined part 601 includes a phase change region 601'. The phase change region 601' can be changed in its state with a much higher heat efficiency as a result of its confined structure. Thus, the phase change memory element may provide lower power consumption, particularly, during a write operation.

According to some embodiments of the present invention, a phase change memory element can have a specific structural configuration and characteristics. Particularly, a phase change memory layer is provided with a confined part, and the phase change memory layer is formed on a lower electrode. The confined part is defined in such a manner that a surface of the TiN lower electrode of the phase change memory element is selectively recessed, a recess is formed on the recessed lower electrode, and the confined part is provided in the recess. Furthermore, since the confined part of the phase change memory layer is substantially surrounded by the spacer(s) on the sidewall(s) of the recess and an insulating layer behind the spacer(s), it can be effectively insulated by the insulating effect of the spacer(s) and the insulating layer.

Accordingly, the Joule heating of the confined part of the phase change memory layer may be effectively confined to the layer. Therefore, the effectiveness of the confined part of the phase change memory layer to serve as a phase change region may be increased by the insulating effect, and the power consumed during the operation of the phase change memory element may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase change memory element, comprising:
an insulating layer on a semiconductor substrate, the insulating layer having a through hole penetrating the insulating layer;
a lower electrode in a recess in the through hole, wherein the recess has a sidewall comprising a portion of the insulating layer;
a phase change memory layer on the lower electrode, the phase change memory layer having a portion confined by the recess and surrounded by the insulating layer;
an upper electrode on the phase change memory layer; and
an oxide layer disposed between the lower electrode and the portion of the phase change material layer confined in the recess.

2. The phase change memory element of claim 1, further comprising a spacer on a sidewall of the through hole such that a transverse cross-sectional area of the lower electrode in the through hole is smaller than a transverse-cross-sectional area of the through hole.

3. The phase change memory element of claim 2, wherein the spacer comprises:
a first spacer layer on the sidewall of the through hole; and
a second spacer layer on the first spacer layer.

4. The phase change memory element of claim 3, wherein the first spacer layer comprises a first insulating material having a first step coverage characteristic and the second spacer layer comprises a second insulating material having a second step coverage characteristic indicating less step coverage than the first insulating material.

5. The phase change memory element of claim 3, wherein the spacer has a substantially vertical sidewall.

6. The phase change memory element of claim 1, wherein the lower electrode comprises TiN and/or TiAlN.

7. A phase change memory element, comprising:
an insulating layer on a semiconductor substrate, the insulating layer having a through hole penetrating the insulating layer;
a lower electrode in a recess in the through hole, wherein the recess has a sidewall comprising a portion of the insulating layer;
a phase change memory layer on the lower electrode, the phase change memory layer having a portion confined by the recess and surrounded by the insulating layer;
an upper electrode on the phase change memory layer; and
a spacer on a sidewall of the through hole such that a transverse cross-sectional area of the lower electrode in the through hole is smaller than a transverse-cross-sectional area of the through hole,
wherein the spacer comprises:
a first spacer layer on the sidewall of the through hole; and
a second spacer layer on the first spacer layer; and
wherein the first spacer layer comprises a first insulating material having a first step coverage characteristic and the second spacer layer comprises a second insulating material having a second step coverage characteristic indicating less step coverage than the first insulating material.

8. The phase change memory element of claim 7, wherein the spacer has a substantially vertical sidewall.

* * * * *